United States Patent [19]

Frazier

[11] Patent Number: 4,769,644
[45] Date of Patent: Sep. 6, 1988

[54] CELLULAR AUTOMATA DEVICES

[75] Inventor: Gary A. Frazier, Garland, Tex.

[73] Assignee: Texas Instruments Incorporated, Dallas, Tex.

[21] Appl. No.: 859,596

[22] Filed: May 5, 1986

[51] Int. Cl.⁴ .......................... H04Q 1/00; G06K 9/60
[52] U.S. Cl. .................................. 340/825.860; 382/50
[58] Field of Search ...................... 340/825.16, 825.86, 340/825.87; 364/571; 358/163, 283, 284; 382/28, 41, 53, 54, 49, 50

[56] References Cited

U.S. PATENT DOCUMENTS

| | | | |
|---|---|---|---|
| 3,794,983 | 2/1974 | Sahin | 382/41 |
| 4,509,195 | 4/1985 | Nadler | 382/41 |
| 4,510,616 | 4/1985 | Lougheed et al. | 382/41 |
| 4,517,659 | 5/1985 | Chamberlain | 340/825.86 |
| 4,541,116 | 9/1985 | Lougheed | 382/54 |
| 4,571,635 | 2/1986 | Mahmoodi et al. | 382/54 |
| 4,667,295 | 5/1987 | Preston, Jr. | 382/41 |
| 4,707,859 | 11/1987 | Nudd | 382/50 |

OTHER PUBLICATIONS

A. Vergis et al., "Testability Conditions for Bilateral Arrays of Combinational Cells", IEEE Transactions on Computers, vol. C35, No. 1, Jan. 86.

K. Steiglitz et al., "A Multi-Processor Cellular Automation Chip", CH2118-8/85/0000-0272, 1985 IEEE; 1985 ICASSP272.

K. Preston, Jr. et al., "Basics of Cellular Logic with Some Applications in Medical Image Processing", Proceedings of the IEEE, vol. 67, No. 5, May 1979.

Primary Examiner—Donald J. Yusko
Attorney, Agent, or Firm—Carlton H. Hoel; Leo N. Heiting; Melvin Sharp

[57] ABSTRACT

Noise and fault tolerant devices made of cellular automata are disclosed. Preferred embodiments include cellular automata with updating rules that set a cell to a first state if more than a threshold number of adjacent cells are in the first state and with output being a state average over all cells; thus updating overcomes noise and fault induced state changes. Embodiments with cells as discrete electronic devices and with cells as quantum wells in a monolithic semiconductor body are disclosed.

11 Claims, 18 Drawing Sheets

TIME SLICES FOR 16 X 16 CELL ARRAY

CELLULAR AUTOMATA DEVICES

STATEMENT AS TO RIGHTS TO INVENTIONS MADE UNDER FEDERALLY SPONSORED RESEARCH AND DEVELOPMENT

The U.S. Government has a paid-up license in this invention and the right in limited circumstances to require the patent owner to license others on reasonable terms as provided for by the terms of Contract No. N00014-85-C-0760 awarded by the U.S. Navy.

BACKGROUND OF THE INVENTION

1. Field of the Invention

The present invention relates to electronic devices, and, more particularly, to fault and noise tolerant devices made of aggregations of locally-interacting cells.

2. Description of the Related Art

Growth in the semiconductor industry has been a strong function of the density of on-chip computational resources. Much of current semiconductor research is motivated by the inherent advantages in terms of cost reduction and performance enhancement associated with reducing minimum circuit geometries. For example, the increasing capacity of dRAMs reflects this cost pressure; see H. Sunami, Cell Structures for Future DRAM's, 1985 IEDM Tech. Digest 694–697.

Further reductions in on-chip functional density are inhibited by the saturation of interconnect density and the degradation of device properties as local, interdevice coupling becomes a dominant interaction in scaled systems. The speed and functional density VLSI is now limited by the number and size of the interconnections between gates. Device densities are now reaching the point where classical notions of isolated, functionally independent active elements are giving ground to a highly coupled, quantum mechanical perspective. There is no clear method available that permits the continued downscaling of active elements (and their connections) beyond evolutionary limits.

Basic problems brought on by further downscaling include; unavoidable interdevice crosstalk, interconnect crosstalk, interconnect RC time-constant effects, and the breakdown of classical "transistor" properties in the ultra-submicrometer regime. Furthermore, as the number of electrons that participate in each basic process decreases with scaledown, errors induced by substrate defects, cosmic rays, and thermal fluctuations become more significant. These hardware dilemmas suggest that further increases in the density of on-chip computational resources will require computer architectures that are compatible with future semiconductor technologies, take account of device faults and strong interdevice coupling, and emphasize a reduction in device-level connectivity. Cellular automata may provide the basis for such architectures.

Cellular automata are generally n-dimensional arrays of cells, together with a fixed, local rule for recomputing the value associated with each cell from the values of the neighboring cells. Cellular automata were originally proposed by John von Newmann as mathematical models to study self-replication; see, A. Burks, Ed., Essays on Cellular Automata (Illinois Press, 1970). More recently, they have been considered as possible models of general nonlinear phenomena such as turbulence, and have been used for nonlinear image processing in the biomedical and pattern recognition fields; see, K. Preston et al, Basics of Cellular Logic with Some Applications in Medical Image Processing, 67 Proc. IEEE 826 (1979). Further, cellular automata have the same structure as an FIR filter, but using a general update rule rather than arithmetic, and are suitable models for studying highly parallel, pipelined computation structures for digital signal processing. Also, they can simulate the action of an arbitrary Turing machine and thus are capable of universal computation; see references in K. Steiglitz et al, A Multi-Processor Cellular Automaton Chip, 1985 ICASSP 272.

In principle, a variety of cellular automata can imitate all of the logical operations required of a general purpose computer; see A. Burks Ed., Essays on Cellular Automata (Illinois Press 1970), D. Farmer et al, Cellular Automata (North-Holland Physics Publishing, Amsterdam 1984) and E. F. Lodd, Cellular Automata (Academic Press 1968). Importantly, local-only communication dramatically improves the chances for scaling the architecture since the movement of information between computations is controlled locally. Next-generation device technologies will require the downscaling of active electronic devices to fundamental physical limits. To be successful, devices with revolutionary scalability will require an equally scalable architecture such as cellular automata. Finally, we note that current research into improving digital signal processing (DSP) algorithms is establishing the usefulness of decomposing complex, existing DSP functions into simple, modular, massively parallel sub-functions. For this special class of computation, a fractal architecture, wherein all levels of functionality are structured like systolic cellular automata, may be ultimately the most efficient architecture. Therefore, interest in developing architectures based on cellular automata is prompted by the limits of current practice, the trends in special purpose computation, and the compatibility requirements of next-generation technology.

Previous cellular automaton research has concentrated on their use to simulate the behavior of physical systems; see, generally, D. Farmer et al, Cellular Automata (North-Holland Physics Publishing, Amsterdam 1984). Relatively little effort has been devoted to the understanding, design, and characterization of cellular automata as potential machines for computation. Only the simplest, one-dimensional "line" automata have been studied in any detail. The complex activities associated with multi-dimensional cellular automata remain largely unexplored. Existing models do not yet provide practical, or comprehensive computational solutions. What is required are constructions that can execute both general purpose and problem specific algorithms at high speed, while accounting for the practical problems of ultra-downscaled circuits such as the sensitivity to electrical noise in these components.

No real multistate machine can be fault free. This conclusion follows from thermodynamics. However, there are two approaches that provide essentially error-free hardware in a thermal world. In the first method, the system can be designed using components that are collectively so reliable that soft (dynamic, recoverable) errors are assumed to occur after the mean time before failure of any component. Hard (fixed) errors are preempted by preventative hardware replacement. The second scheme assumes a reasonable distribution function for soft errors over time and invokes a strategy to detect and correct errors as they occur. For a theoretical treatment of fault detection in systolic arrays, see A.

Vergis and K. Steiglitz, Testability Conditions for Bilateral Arrays of Combinational Cells, 35 IEEE Trans. Comp. 13 (1986).

A system will be fault tolerant insofar as several input states or signals are mapped by information-dissipative operations into the same output state or signal. As noise is usually statistically uncorrelated, practical fault tolerance requires that noise-induced bifurcations in state trajectory during a computation or memory operation, brought about by random noise, will remain mappable into the desired output state sequence. It should be stressed that shrinking design rules will only exacerbate the problem of signal-to-noise ratio reduction in computing machines. Therefore, functions based upon the probabilistic nature of ultra-submicrometer quantum devices must include self-repair and fault tolerance as basic design considerations.

State machines such as cellular automata may be, but are not always, very sensitive to noise. In a cellular automaton an input state, which is globally defined by the individual cell values, evolves over time to generate new spatio-temporal output states. In many cases, the alteration of a single cell value results in very different system dynamics. Such cases are characterized by a poor tolerance to either faults in the cell operation or noise in the initial input conditions.

SUMMARY OF THE INVENTION

The present invention aggregates locally-connected interacting multistate cells (cellular automata) to provide noise and fault tolerant devices by taking output values as averages over the values of the cells. Preferred embodiments include memory devices with modes of operation such as global pulse setting of the cells and stationary peripheral cell setting. The embodiments include cells as discrete local processors and as distributed monolithic quantum wells.

Providing device function as an average of cell values in a cellular automaton solves the problems of noise and fault tolerance in cellular automata devices and downscaled devices.

BRIEF DESCRIPTION OF THE DRAWINGS

The drawings are schematic for clarity.

DESCRIPTION OF THE PREFERRED EMBODIMENTS

Figure 1:
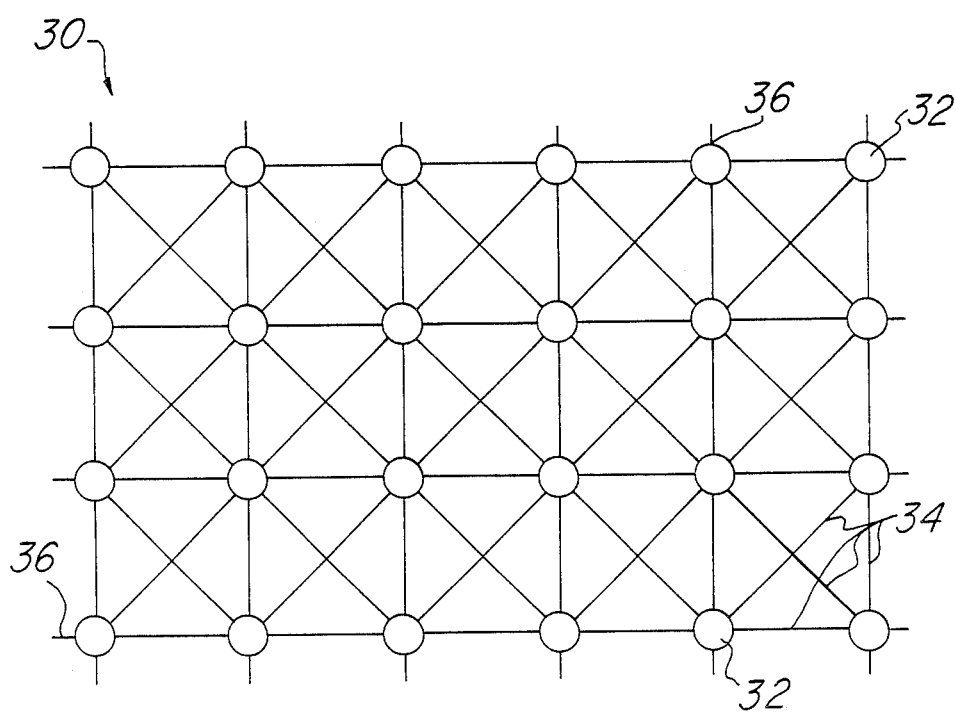
FIG. 1 is a schematic illustration of a basic two-dimensional cellular automaton.

A basic two-dimensional cellular automaton is schematically illustrated in FIG. 1, and generally denoted by reference numeral 30. Essentially, cellular automaton 30 consists of many simple, multistate active devices 32 (the "cells") which are constrained to a regular lattice and allowed to interact directly with other cells 32 within a fixed radius called the cell "neighborhood". These interactions are indicated by the horizontal, vertical and diagonal line segments 34; note that only nearest-neighbor and next-nearest-neighbor cells 32 interact directly in cellular automaton 30. The overall system is a highly parallel collection of simple finite state machines that are coupled essentially in two dimensions. Each cell 32 makes dynamic adjustments to its state according to changes in its local environment. In the simpliest case of a deterministic, binary automation, each cell uses the bit pattern of its neighbors as a pointer into a pre-defined look-up table. The table entry addressed at time t, defines the new cell state at time t+1. Also, cellular automaton 30 has connections 36 for input and output signals; thus at time t the top row of cells 32 can each be set to selected state and then at time t+k the states of these cells can be detected. Alternatively, every cell 32 could have an input/output connection or all of the cells on the periphery could have input/output connections.

Figure 2:
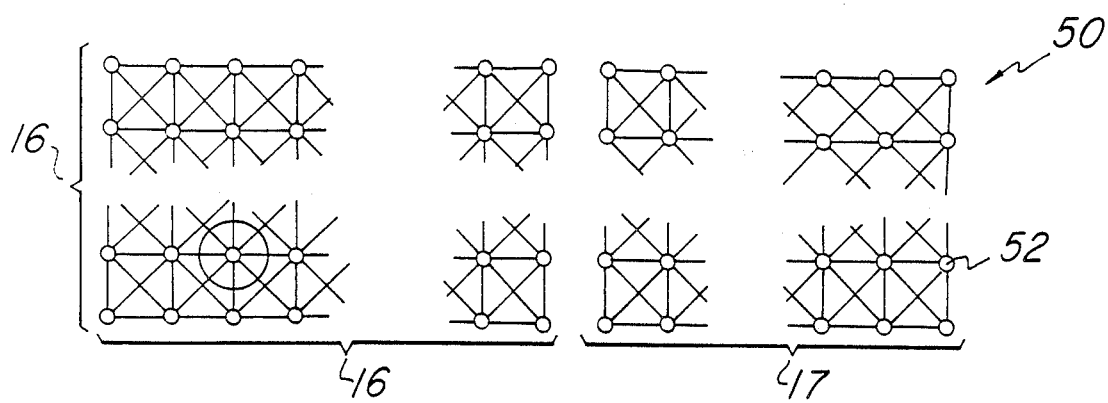
FIG. 2 is a schematic diagram of a first preferred embodiment.
Figure 2:
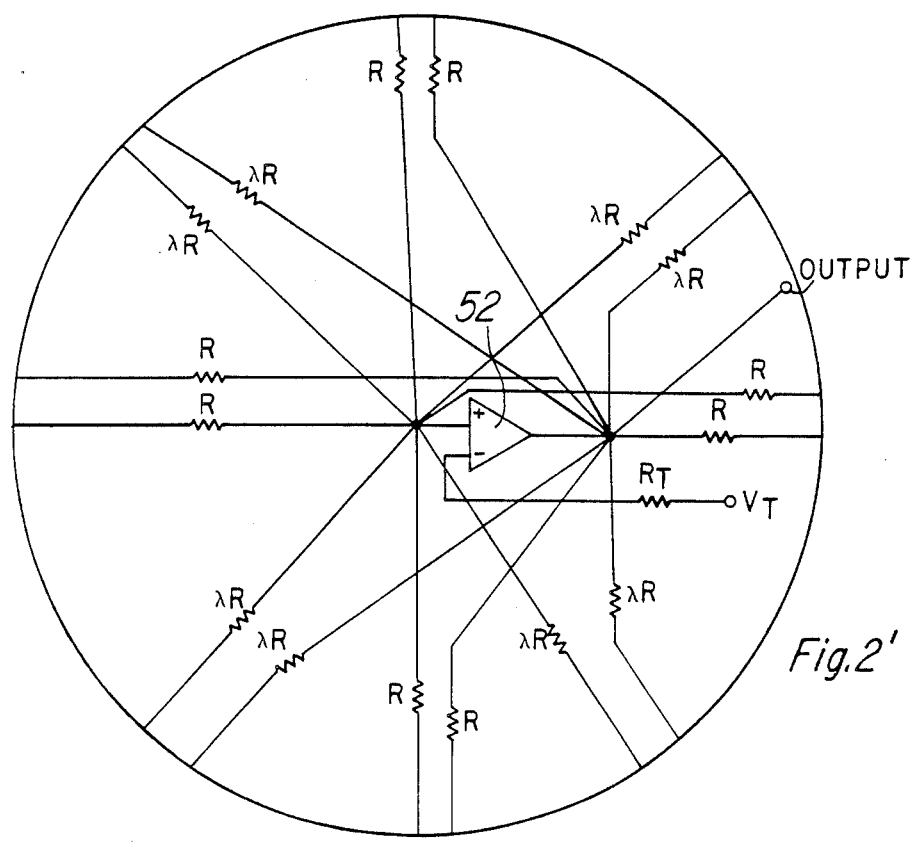

FIG. 2 is a schematic diagram of a first preferred embodiment cellular automaton, generally denoted 50, organized as a noise-tolerant two bit memory. Memory 50 includes five hundred and twelve comparators 52 which are interconnected as two separate sixteen-by-sixteen lattices 16 and 17 (each lattice represents one bit); details of the interconnections within lattice 16 are shown in the insert. Each interconnection between neighboring comparators 52 has two resistor-loaded wires: one from the first comparator's output to the second comparator's input, and one from the second comparator's output to the first comparator's input. For comparators 52 of cells on the periphery of each of the lattices, the interconnections are modified to so that the inputs and outputs of these cells are connected in the usual way to the outputs and inputs of nearest- and next-nearest-neighbor cells but additional interconnections to the peripheral cells are provided to convey signals to and from adjacent cells in lattice 17.

In memory 50 the resistors interconnecting nearest-neighbor comparators (horizontally or vertically separated in FIG. 2) all have the same resistance and the resistors interconnecting next-nearest-neighbor comparators (diagonally separated in FIG. 2) all have the same resistance which is λ times the resistance of the nearest-neighbor connections. Each comparator 52 also has a threshold voltage source $V_T$ connected through a resistor $R_T$ to this its input, so comparator 52 gives a high output voltage if the current into the direct input exceeds the current into its inverting input and gives a low output voltage otherwise. Comparator 52 could be an LM1900 or similar device in which the inputs are both near virtual ground and the current difference is amplified. Thus, if the comparators 52 have steady state output values equal to 0 or V and if the nearest-neighbor resistance is R, then picking $V_T$ and $R_T$ so that $$\frac{(2\lambda + 2)V}{\lambda R} > \frac{V_T}{R_T} > \frac{(\lambda + 4)V}{\lambda R} \text{ and } \frac{(2\lambda + 1)V}{\lambda R}$$

implies the output of comparator 52 will be V if three or more of the nearest-neighbor comparators 52 have V output or if two of the nearest-neighbor comparators 52 plus two or more of the next-nearest-neighbor comparators 52 have V output; otherwise the output will be 0. ($\lambda > 2$ is required.) This determination of output based on neighboring outputs is the cellular automaton rule for updating the cell state for memory 50. Note that the usual conception of synchronous updating in a cellular automaton could be explicitly invoked for memory 50 by adding clocked flip-flops to delay the input a time period from the output. In memory 50 the updating is asynchronous and proceeds roughly with the speed of the rise times of comparators 52. Also, if LM1900s are used, then V could be about 10 volts and R about 1 M$\Omega$; with $\lambda = 3$ and $V_T$ also about 10 volts, $R_T$ could be about 133 k$\Omega$.

Of course, other sets of resistor values, including relaxation of the constraint that all nearest-neighbor interconnections have the same resistance and that next-nearest-neighbor interconnections be weaker than nearest neighbor connection strengths, lead to other updating rules, but which involve similar properties of noise resistance.

The contents of each of the bits of memory 50 are sensed by averaging over all of the outputs of comparators 52, and the bits can be set by varying the threshold voltage $V_T$. Alternatively, subgroups of cells may have their $V_T$ inputs collectively contacted for setting or resetting a fraction of the lattice. Also, the control signals to the peripheral cells can be removed at time t+k, and the average state of the lattice sensed by reading the average of the peripheral cells.

Figure 3:
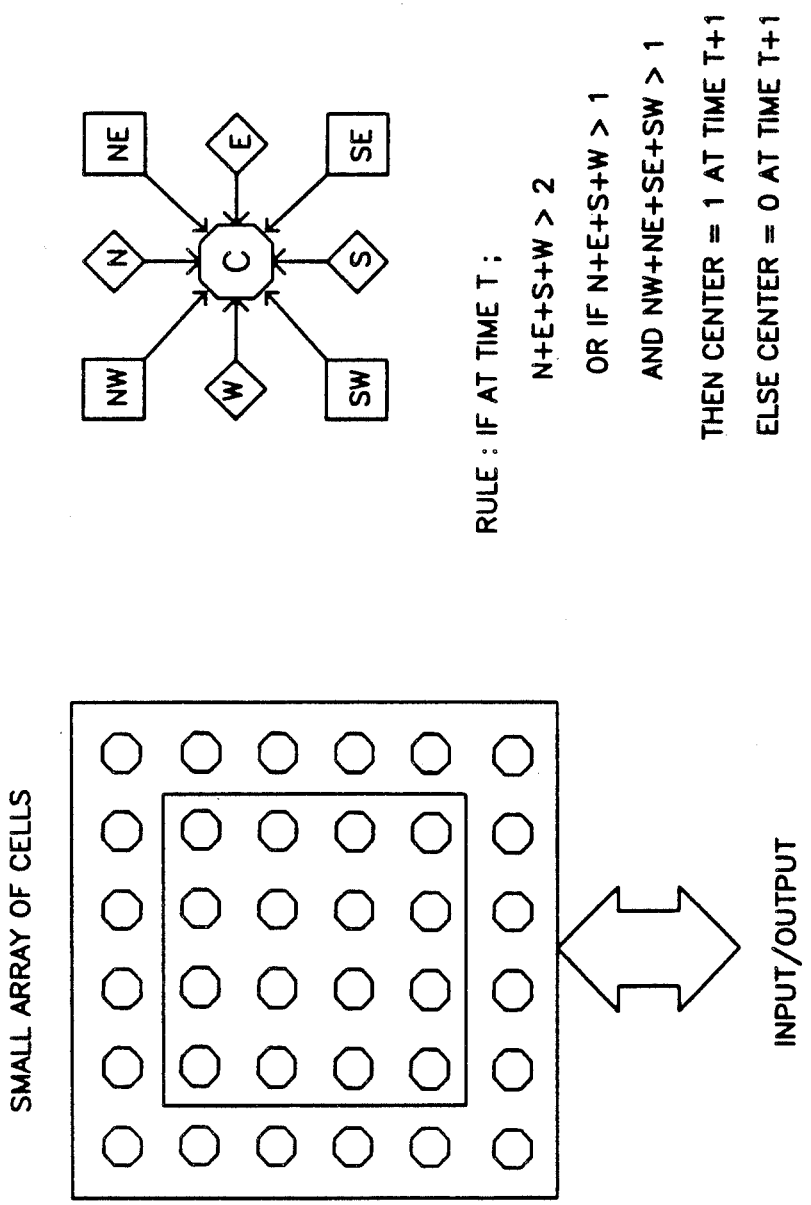
FIG. 3 is an illustration of a thresholding, totalistic rule.
Figure 4:
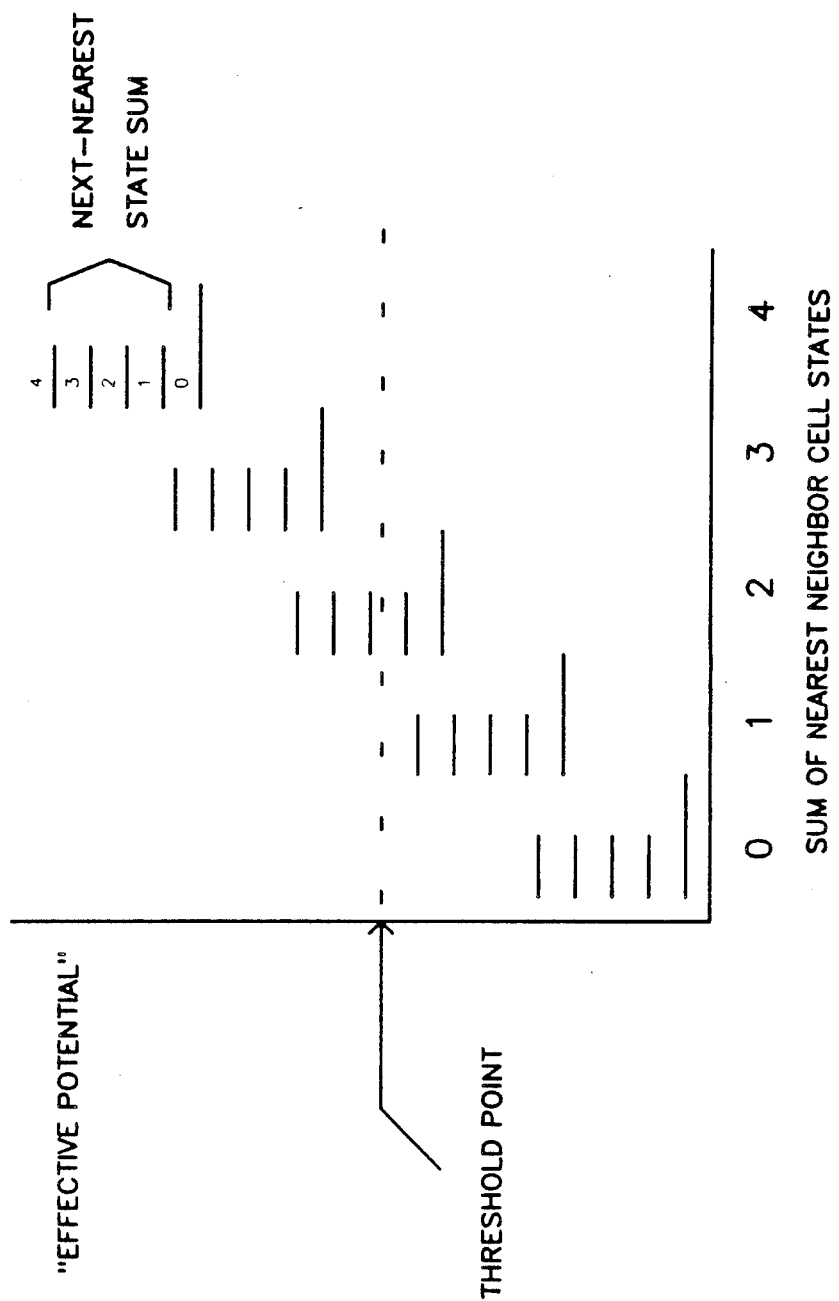
FIG. 4 is an illustration of the "effective potential" for the rule of FIG. 3.

The operation and noise sensitivity of memory cell 50 are best illustrated by simulations. Note that memory cell 50 is a simple cellular automaton system based on the Ising model of interacting two-state particles. In this model, the coupling strength between cells is a function only of their separation. As a result, the transition function that specifies the future state of a cell is determined by the value and range, but not the azimuth, of neighboring cells. This class of automata is often described as "Totalistic" since the transition rules can be expressed in terms of summations over cell states and separations. In addition, the interaction rule can be constrained to be a monotonic function of the total interaction between a cell and its neighborhood. The combination of these two simplifications produces transition rules that are equivalent in action to majority vote logic gates that have weighted inputs. One example of a thresholding, totalistic rule is given in FIG. 3. A coupling "potential" diagram consistent with this particular rule is shown in FIG. 4. In effect, the coupling strength between cells is made inversely proportional to intercell separation. Examples of the time evolution of one of the lattices of memory 50 are shown in FIGS. 5 through 13. A detailed discussion follows.

All cells in the array operate according to the same totalistic rule, which can be expressed as follows: If more than two of the N-E-S-W cells are in state "1," the center cell will be forced into state "1." Further, if more than one of the set of N-S-E-W cells are in state "1," and more than one of the set of NW-NE-SE-SW cells are in state "1," then again, the center cell will go to state "1." In all other cases the center cell will go into state "0." Although simple in construction, such an automaton has very useful properties.

Figure 5:
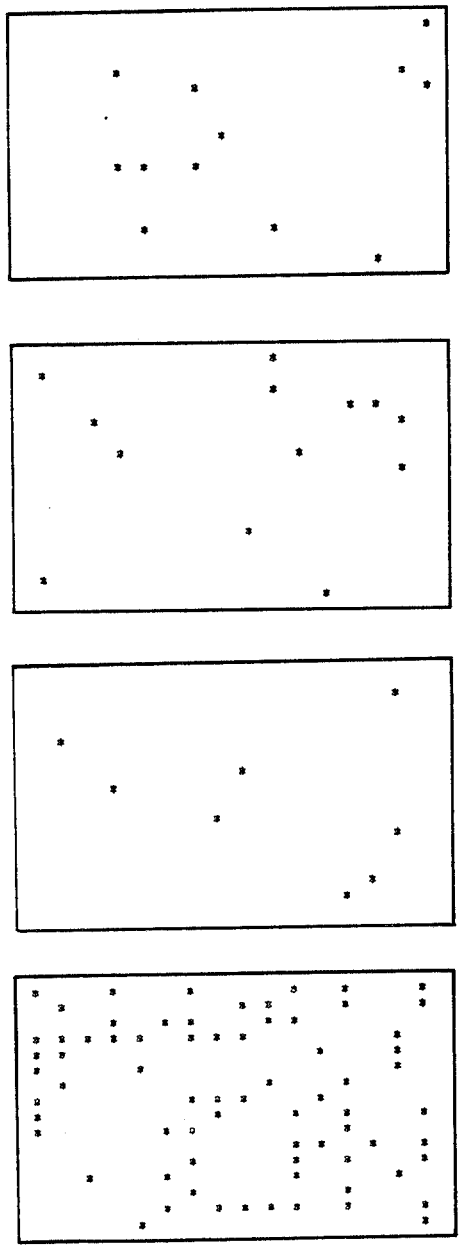
FIGS. 5-13 are examples of the time evolution of the first and second preferred embodiments.
Figure 6:
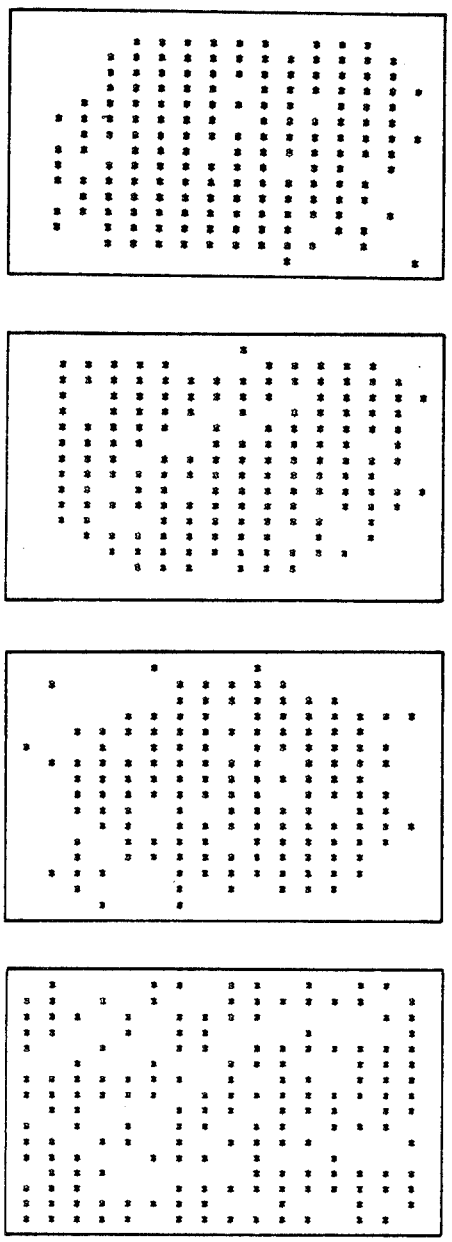

The lattice is initialized to contain a desired pattern of states "0" and "1," as shown in FIGS. 5 and 6 with "1" represented by an asterisk and "0" by a blank. Conveniently, the lattice may be initialized to a given average density of cells in state "1", without regard to placement. Only the relative number os cells in state "1" to cells in state "0" is important to define the average initialization state. Following this write operation, the system is allowed to evolve to a stable average density of state "1" cells. This stable mean value is taken as the definition of the overall state of the lattice and thus the bit content of the corresponding bit of memory 50. The initialization is analogous to placing a transient magnetic field across a magnetic Ising spin system.

Figure 7:
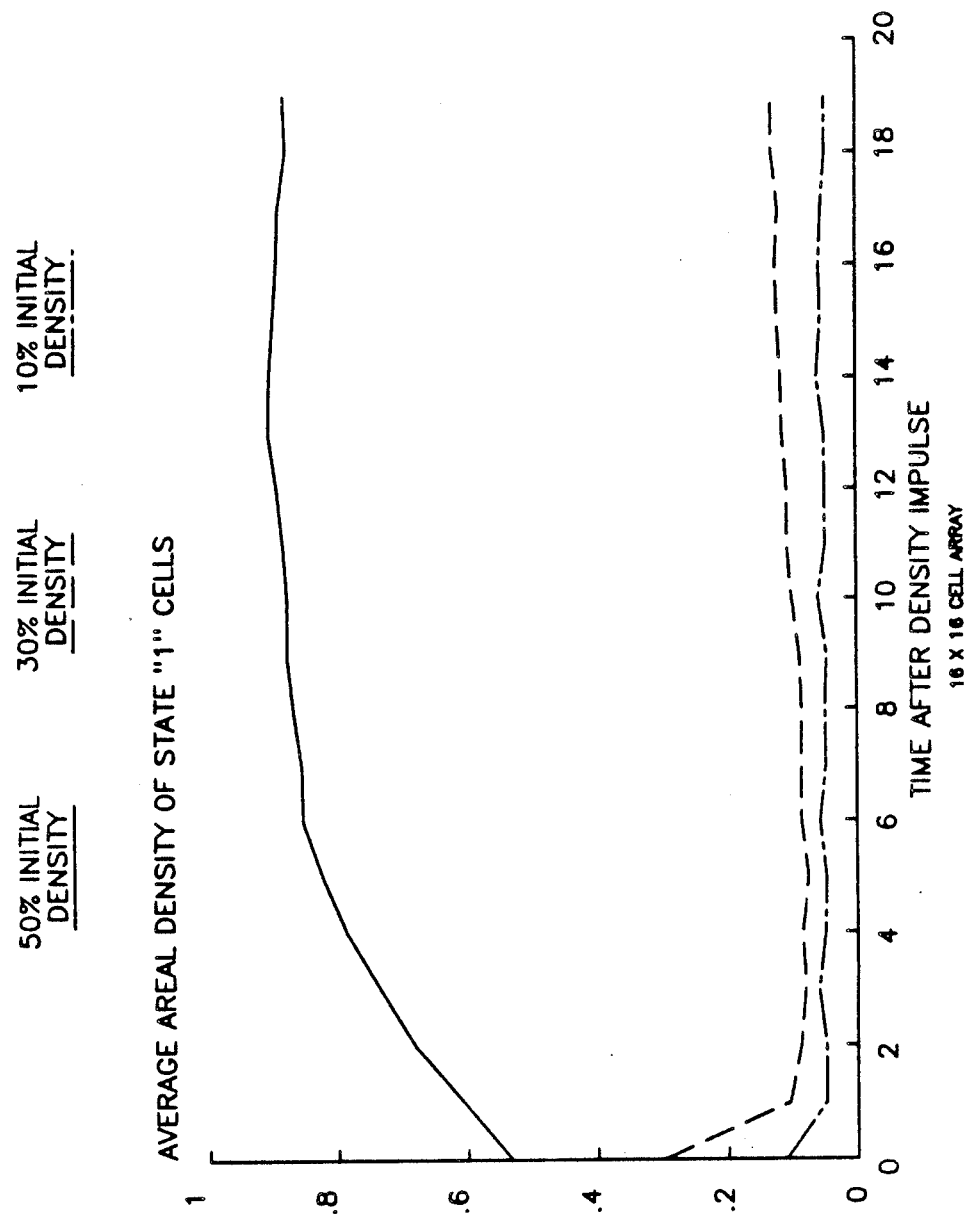
Figure 8:
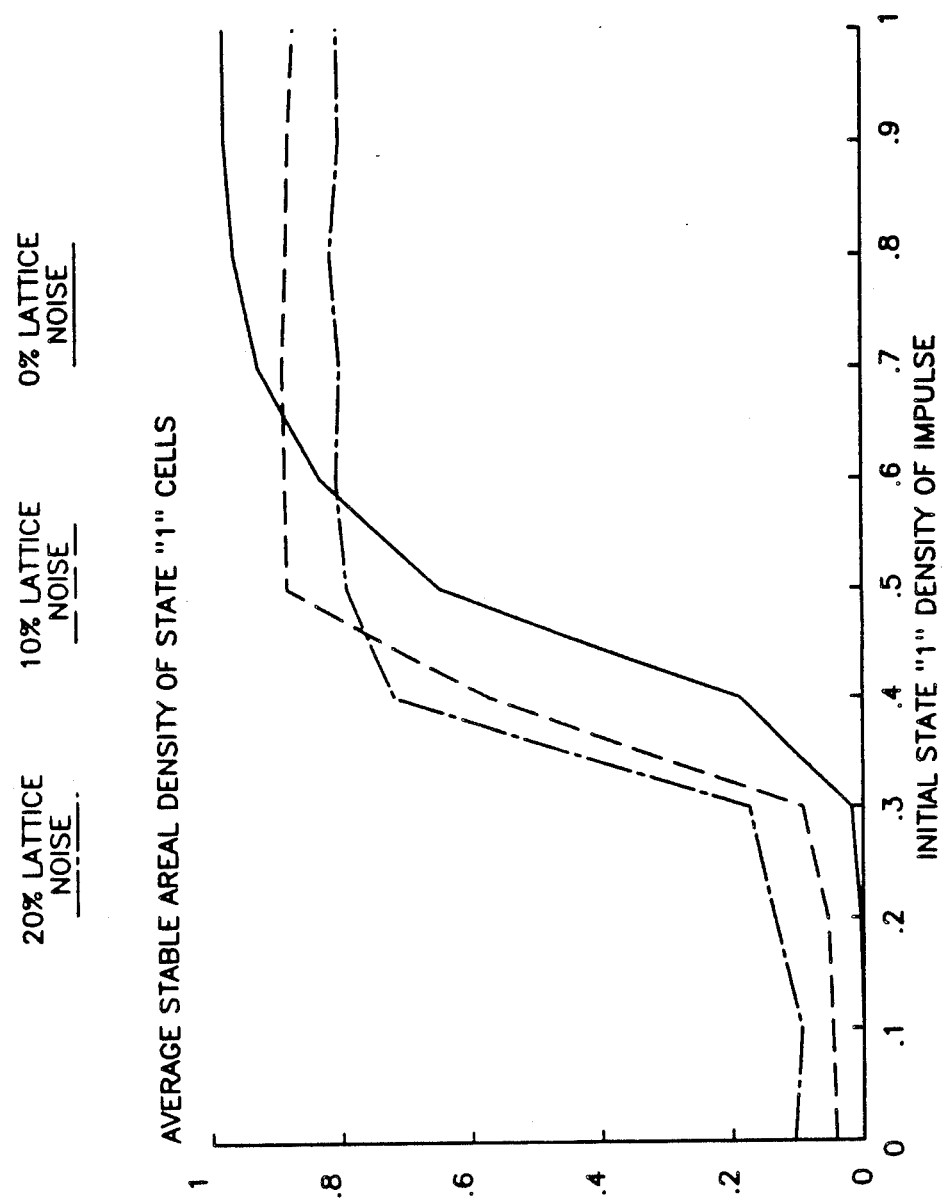
Figure 9:
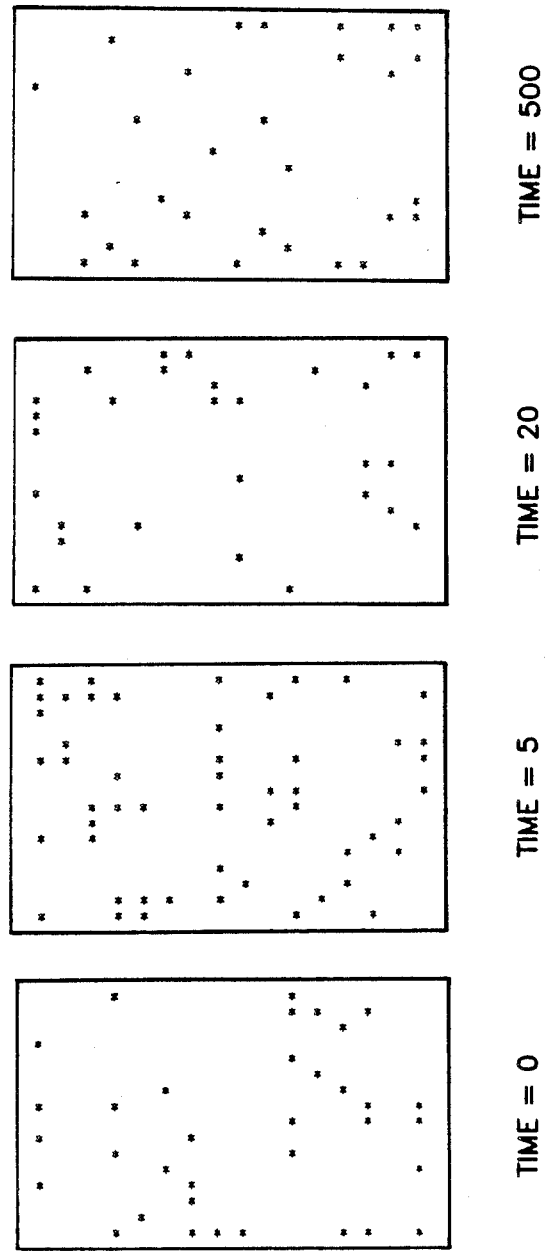
Figure 10:
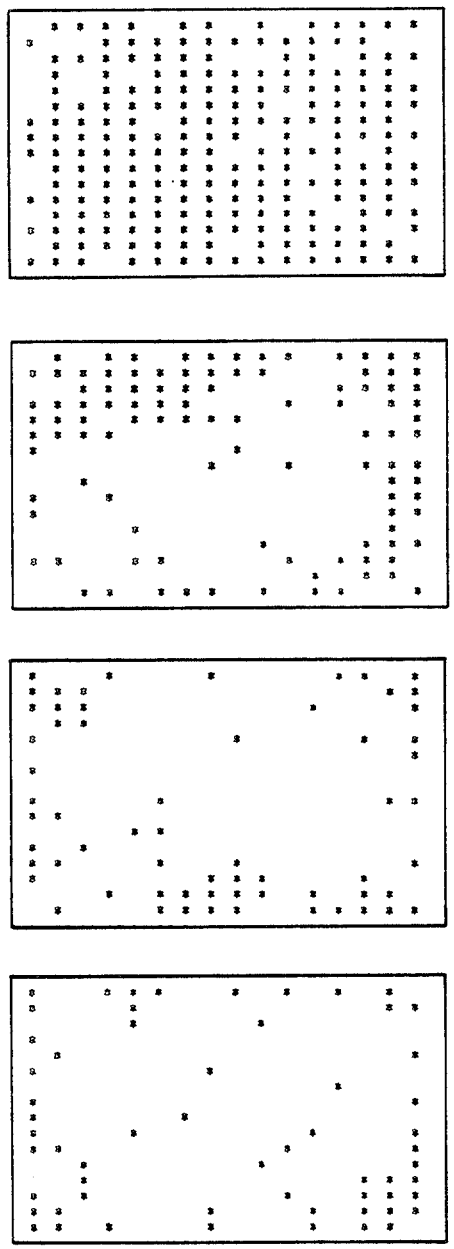
Figure 11:
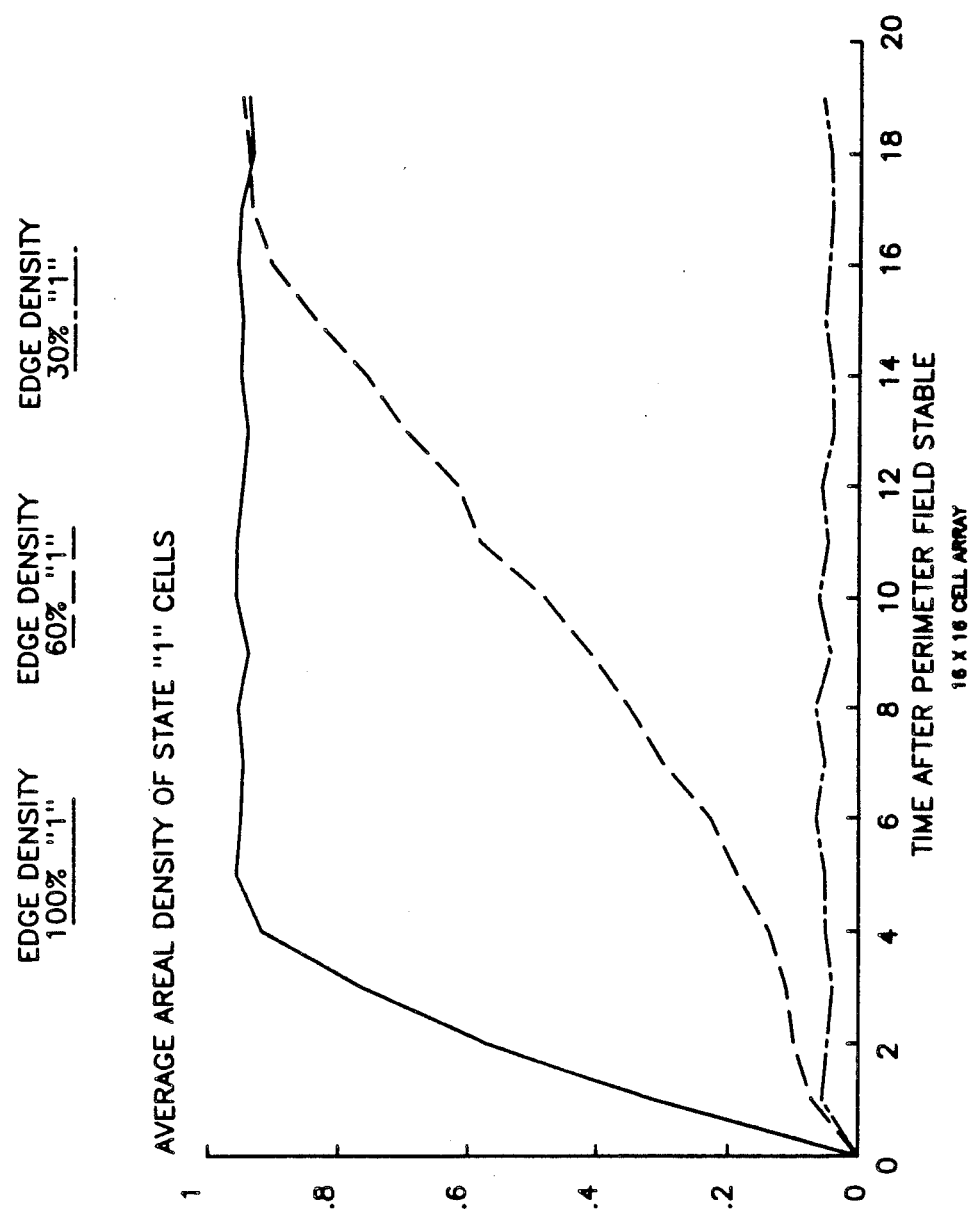
Figure 12:
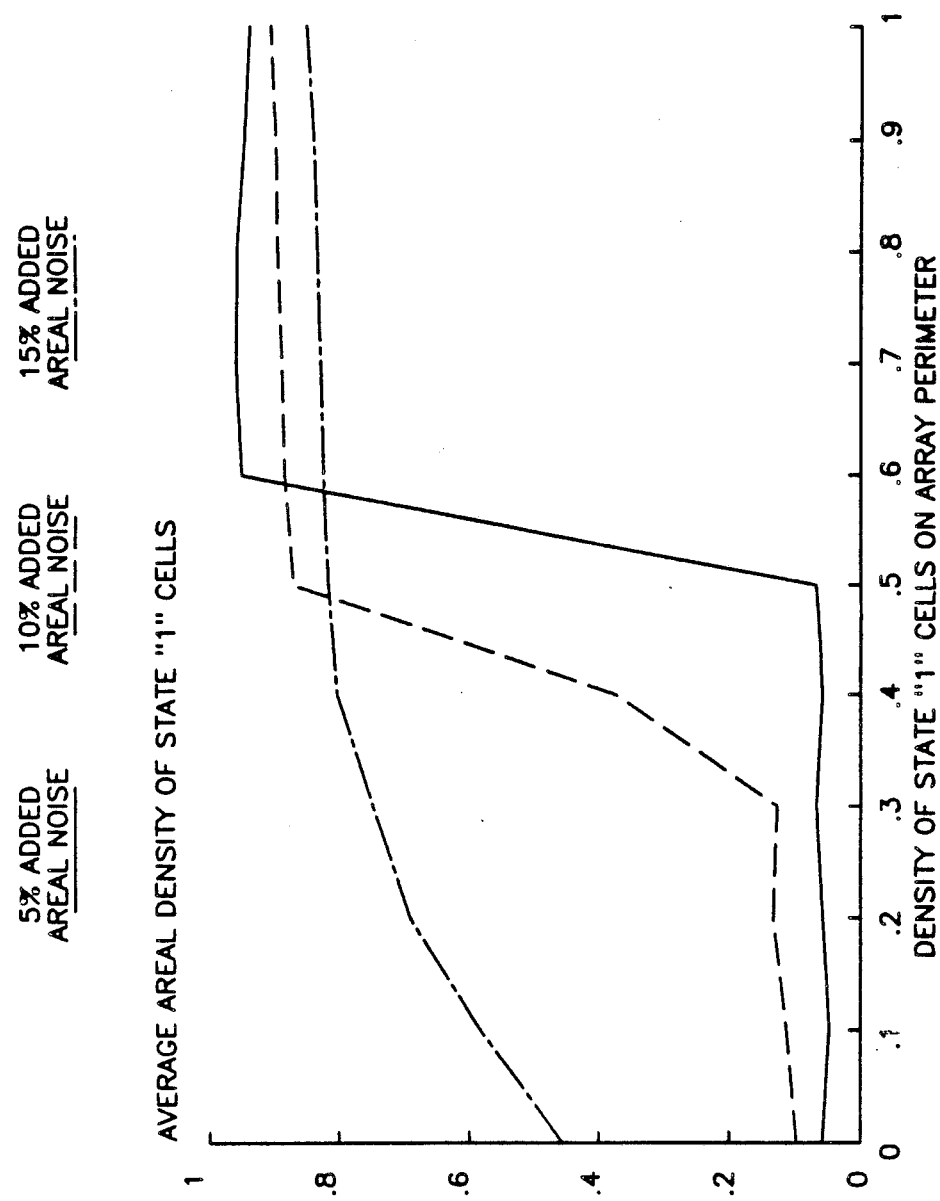

As shown in FIGS. 7 and 8, the final stable density of state "1" cells is quite sensitive to the initial conditions. Moreover, at a critical initial areal density of about 0.4, the system can be separated into a dilute (few cells in state "1") and a dense (few cells in state "0") phase, characteristics of the two-dimensional magnetization isotherms observed in conventional magnetic spin systems. As indicated in FIG. 8, this condensation of state "1" cells is tolerant of significant levels of random cell-state noise. This translates to failures or glitches in comparators 52.

Figure 13:
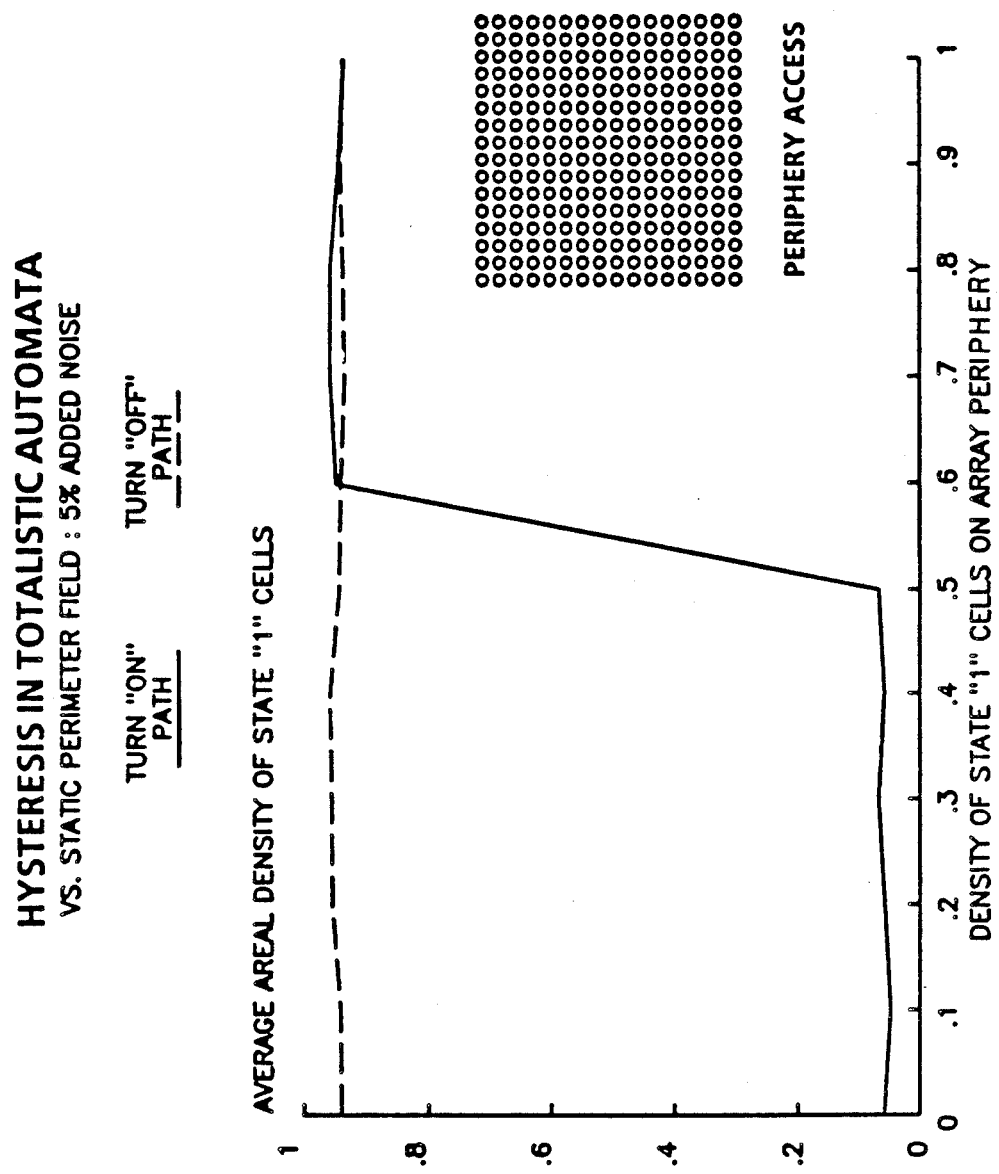
Figure 14:
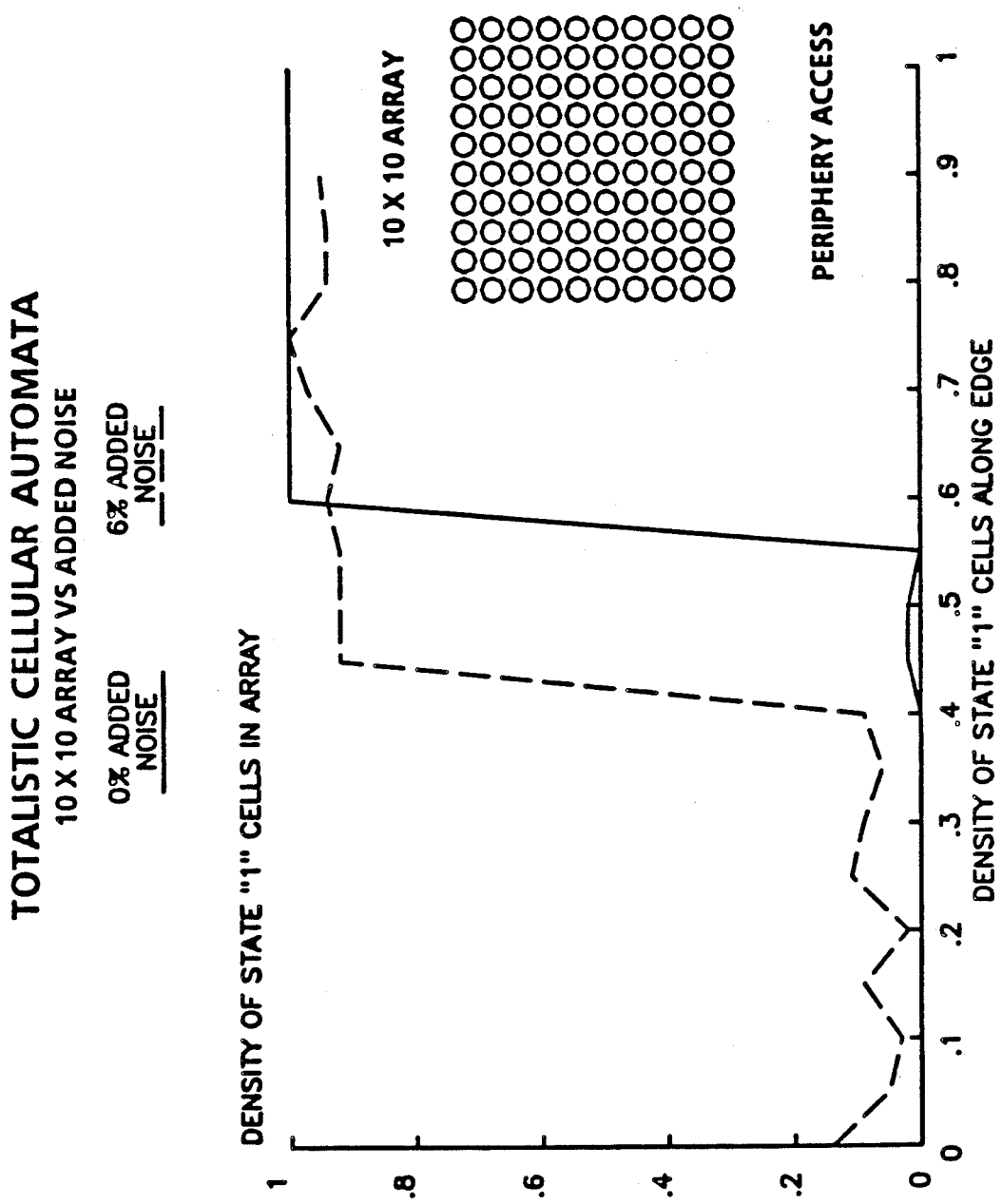
FIGS. 14-16 are examples of the lattice size dependence for the first and second embodiments.
Figure 15:
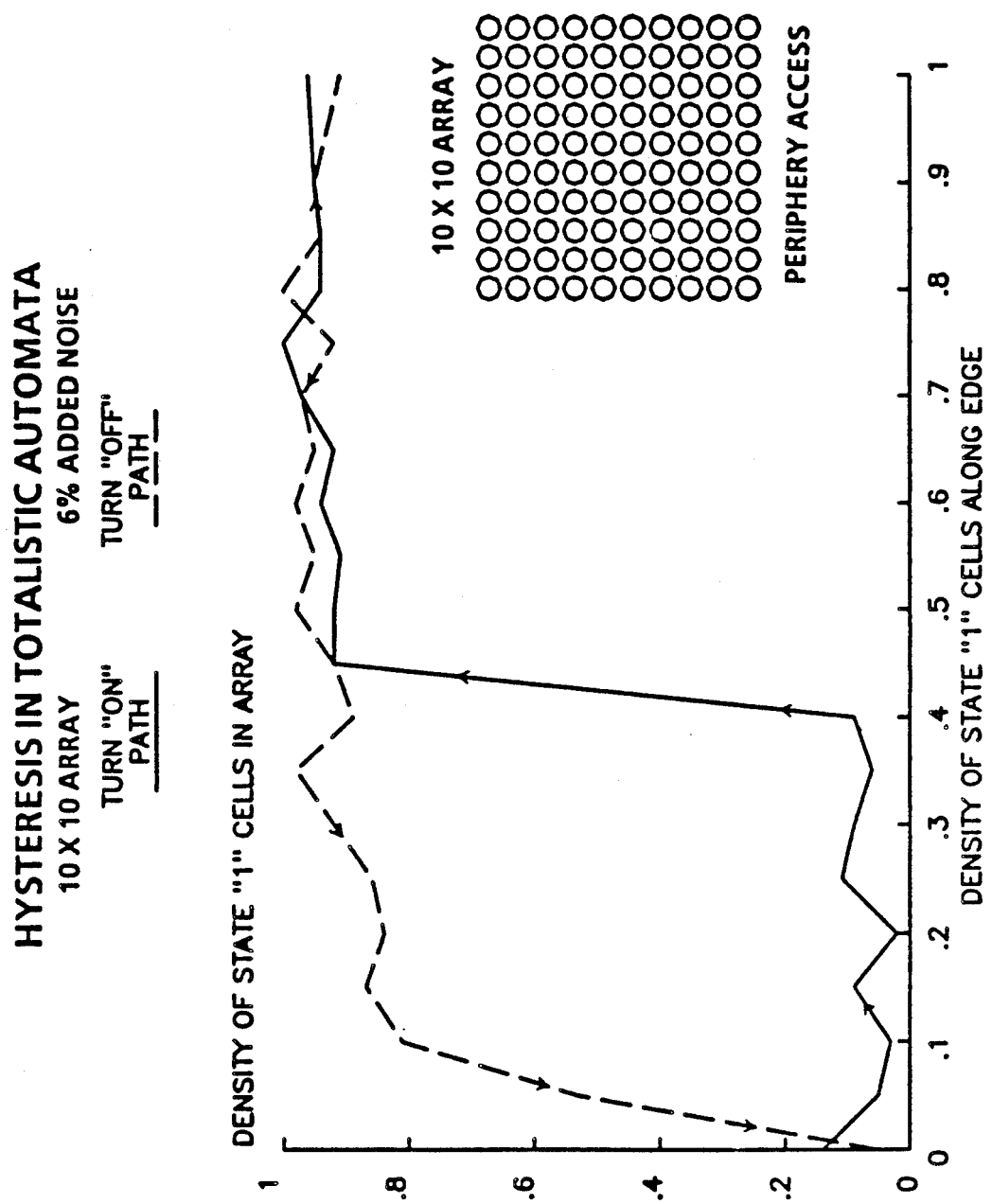
Figure 16:
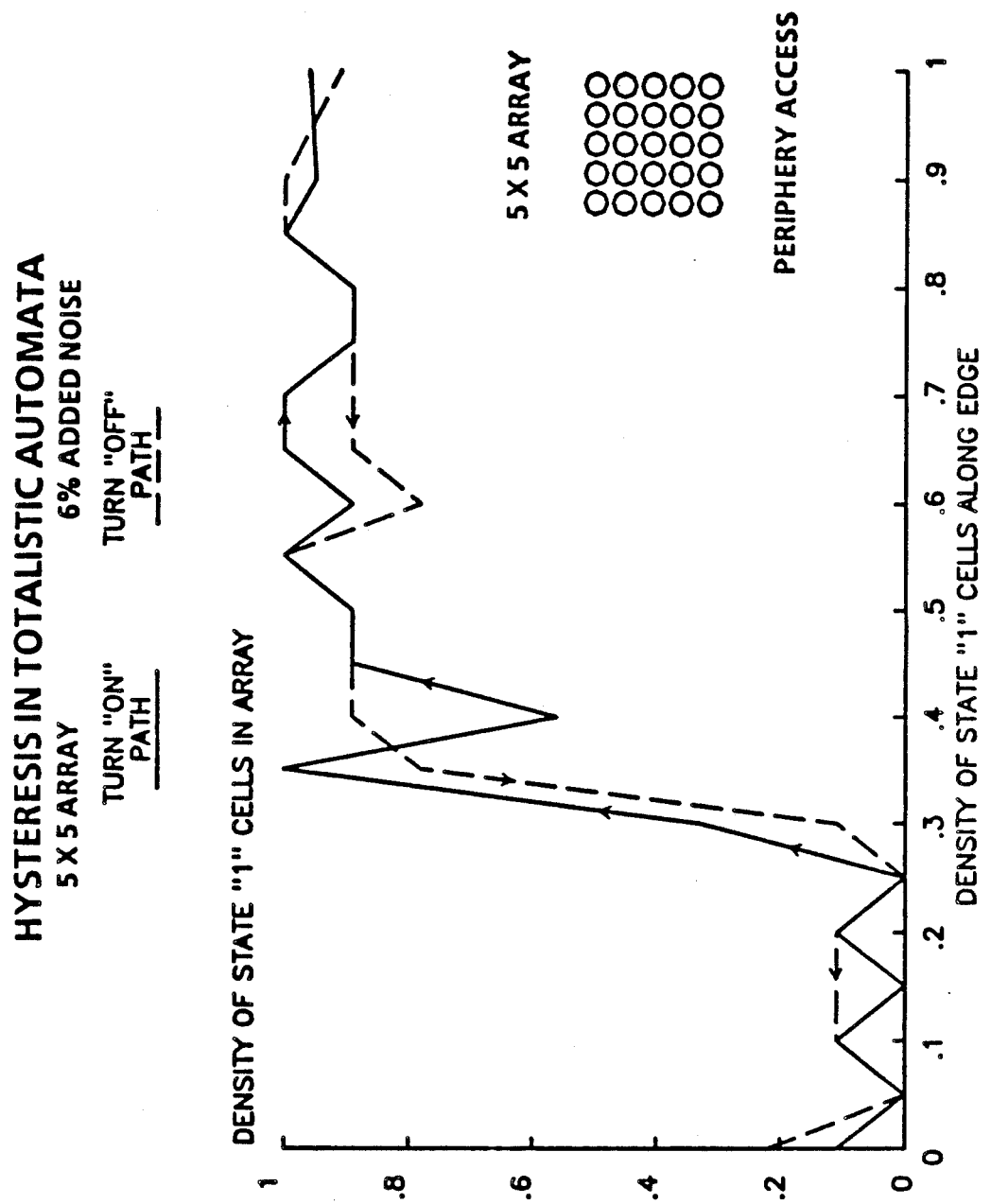

Second preferred embodiment memory 60 is similar to memory 50 but with additional external inputs for all of the cells on the periphery of the two lattices; this leads to a second mode of operation. In the second mode of operation, the Static Periphery mode, the central regions of the lattice are not disturbed by an initialization procedure. Rather, the average density of state "1" cells on the periphery of the lattice is adjusted. The $V_T$s are collectively tied together or each is independently connected to an external source. As shown in FIGS. 9 through 12, it is possible to induce a type of state transformation similar to that observed in the first mode without accessing the internal operations of the array. Finally, as shown in FIG. 13, this mode displays a strong hysteresis in the relationship between average state "1" density and lattice boundary conditions. The location and shape of this hysterisis action between the average value of the controlling peripheral cells and the average value of the controlled latice cells can be adjusted by changing the cell interaction threshold value, or changing the lattice size or aspect ratio. Operation according to the aforementioned rule, but with fewer lattice cells is shown in FIGS. 14-16. The Static Periphery mode displays phenomena similar to the effects of surface magnetic fields on bulk ferromagnetic systems.

Figure 17A:
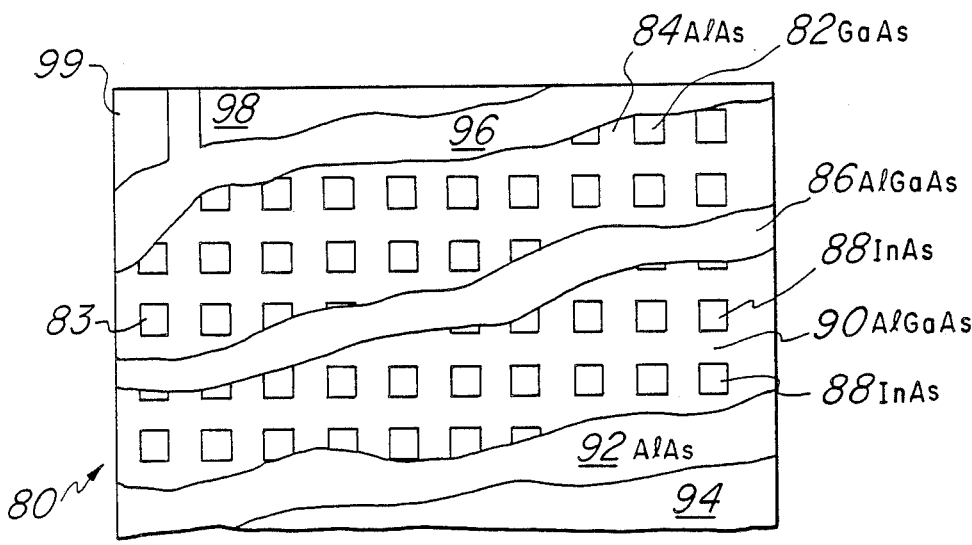
FIGS. 17A-B are plan and elevation views of a third preferred embodiment.
Figure 17B:
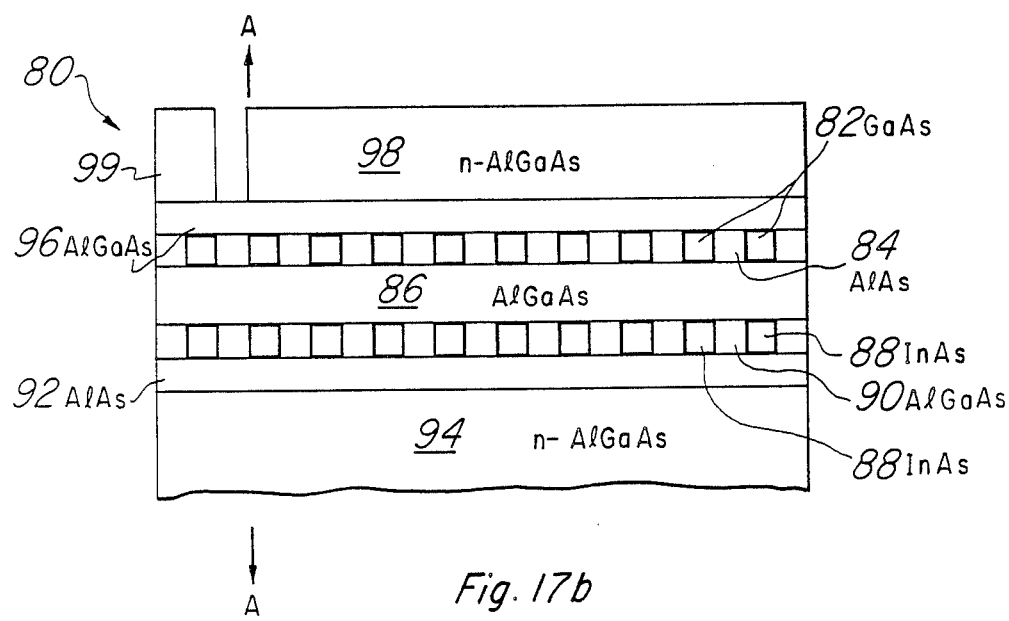

Third preferred embodiment cellular automaton device, generally denoted 80 and illustrated in cutaway plan view in FIG. 17A and cross sectional elevation view in FIG. 17B, consists of a single crystal of matched semiconductor materials including a lattice of GaAs quantum wells 82 imbedded in an AlAs layer 84, $Al_y Ga_{1-y}As$ tunneling barrier layer 86, a lattice of InAs quantum wells 88 imbedded in $Al_x Ga_{1-x}As$ layer 90, AlAs tunneling barrier 92, n-$Al_x Ga_{1-x}As$ electrode 94, $Al_y Ga_{1-y}As$ tunneling barrier 96, and n-$Al_x Ga_{1-x}As$ electrode 98. Quantum wells 82 are approximately cubical with sides about 50 Å long and spaced about 50 Å apart; whereas quantum wells 88 are somewhat oblong parallelpipeds with average side length also about 50 Å and spaced about 50 Å apart, as noted infra this spacing is not crucial. Tunneling barriers 86 and 96 are each about 100 Å thick and of alloy composition with y about 0.4, and electrodes 94 and 98 have alloy composition with x about 0.2. Tunneling barrier 92 is about 30 Å thick.

The operation of device 80 is roughly analogous to that of memory 50 with each quantum well 82 the analog of a comparator 52 as follows. The size of quantum wells 82 implies only discrete energy levels for electrons in a well; so the occupancy of the lowest level will be taken to correspond to the comparator having an output equal to V, and the vacancy of the lowest level will correspond to the comparator output equal to 0. Neighboring wells influence a well by occupancy of the neighboring wells implies an electrostatic potential generated by the occupying electrons which shifts the potential (and thus the energy levels) of the well relative to electrode 98. If the potential shift is sufficient, then an electron from the conduction band of electrode 98 can resonantly tunnel into the well and occupy the lowest level; whereas if the potential shift is not sufficient (fewer of the neighboring wells are occupied) then the level in the well is below resonance with conduction band levels of electrode 98. Thus a threshold shift, which corresponds to a threshold number (weighted) of neighboring wells being occupied, exists, and for a well 82 with its lowest level shifted more than the threshold electrode 98 provides electron(s) to occupy the well. This occupancy is an equilibrium of electrons resonantly tunneling in and out.

Figure 18:
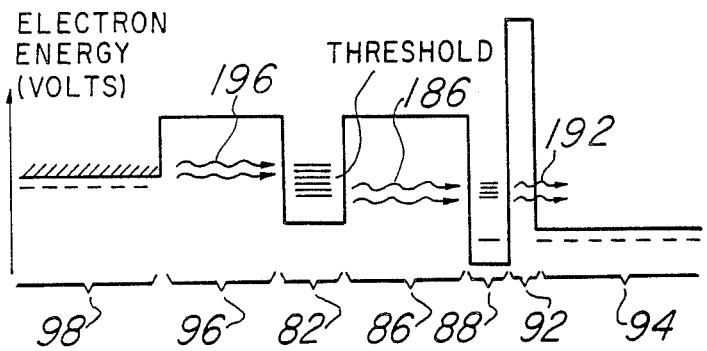
FIG. 18 is a band diagram for the third preferred embodiment.

See FIG. 18 for a band edge diagram along direction A—A of FIG. 17B for illustration of the possible shiftings of the lowest level in well 82 due to various occupancies of the neighboring wells and of the resonant tunneling to a level with threshold shift present as indicated by the wavy arrows 196 through barrier 96. Conversely, if the neighboring wells are primarily unoccupied, then the lowest level in well 82 will be under threshold shift and not be in resonance with levels in electrode 98; however, an electron in the lowest level which is under threshold in well 82 can resonantly tunneling through barrier 86 (wavy arrows 186), well 88, barrier 92 (wavy arrows 192) and into electrode 94. Well 88 provides enough closely spaced levels for resonance with each of the under-threshold shifted levels of well 82 by use of the excited levels of well 88 which are not degenerate because of the non-cubic shape of well 88. (Of course, the number of wells 82 in the lattice determines the spacing of the shifted levels because even faraway wells have some influence, but only the nearby wells have significant influence: a few meV which is comparable to kT for low temperature operation.) Note also that an electron in a well 82 can resonantly tunnel through more than just the closest wall 88, so wells 88 could be of slightly different sizes to provide more levels for resonant tunneling out of the under-threshold shifted levels of well 82. This possibility for different paths of resonant tunneling is enhanced by the spacing of wells 82 being smaller than the spacing of the lattice of wells 88 from the lattice of wells 82; thus the increase in distance for tunneling to the neighbors of the closest well 88 rather than to the closest well 88 is not large compared to the distance to the closest well 88. The coupling between wells 82 is limited by the use of material (AlAs) with high barrier height between the wells 82 but with large dielectric constant so the electrostatic influence is not attenuated; this avoids the lattice of wells 82 degenerating into a superlattice. Tunneling barrier 86 is much thicker than tunneling barrier 92, so the electrostatic influence of charge in the occupied wells 82 on the levels of wells 88 is much less than the influence on other wells 82, and shifting of the levels in wells 88 for sparsely occupied wells 82 is not a problem.

Note that if the levels in wells 88 extended to some over threshold shifted levels in wells 82, then this would not disrupt the cellular automaton operation because electrons would continually resonantly tunnel into these levels and replenish the electrons being drained out by resonant tunneling through wells 88.

With the threshold at approximately the center of the range of the shifted lowest levels, wells 82 are electrostatically interconnected to approximately the same extent as the cells of memories 50 and 60 and device 80 forms a cellular automaton of similar properties. Thus the same noise and fault tolerance exists, but device 80 is extremely small. Note that the average well 82 occupancy (either mostly occupied or mostly empty) in device 80 can be directly determined by the resonant tunneling level laterally through the lattice of wells 82: if most wells are occupied, then the level (which may be one of the excited levels so the AlAs barrier to tunneling is less than for the lowest level) is shifted. However, detection of the average occupancy by detection of a group of peripheral wells is simpler and permits direct connection of an adjacent cellular automaton in the same single crystal semiconductor.

The peripheral wells 83 (illustrated as the left hand column of wells in FIGS. 17A-B) can be separately controlled with a separate electrode 99; this permits Peripheral Mode operation as described in connection with memory 60.

Fourth preferred embodiment cellular automaton device, generally denoted 100, is similar to device 80 but simplified to operate in a current mode: rather than storing electrons in quantum wells and using their electrostatic charge to shift levels in neighboring wells, resonant tunneling currents through the wells provides the charge in the wells to shift levels in neighboring wells.

Figure 19A:
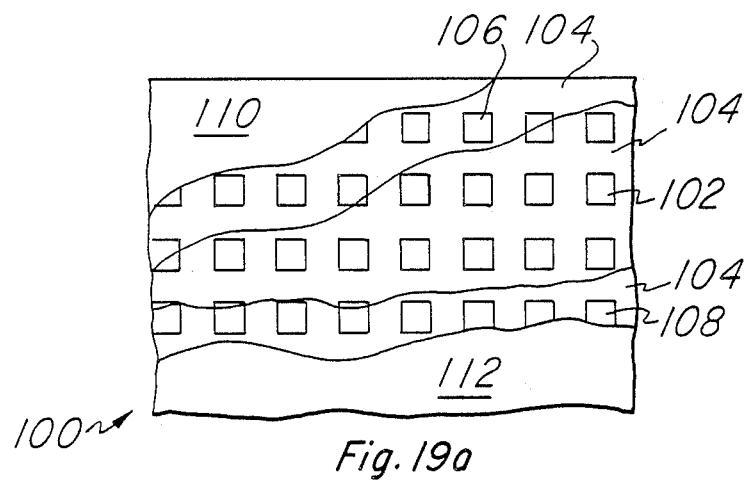
FIGS. 19A-B are plan and elevation views of a fourth preferred embodiment.
Figure 19B:
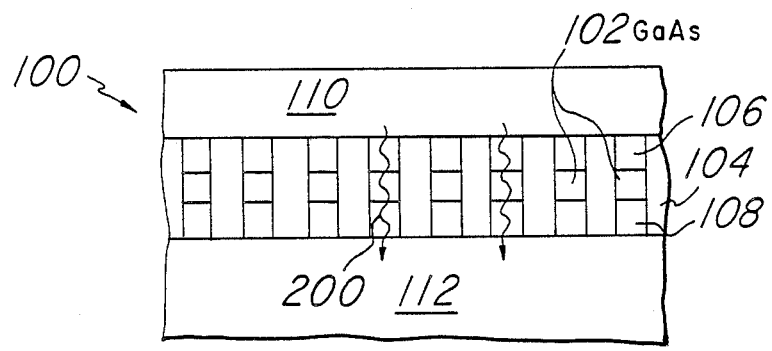
Figure 20:
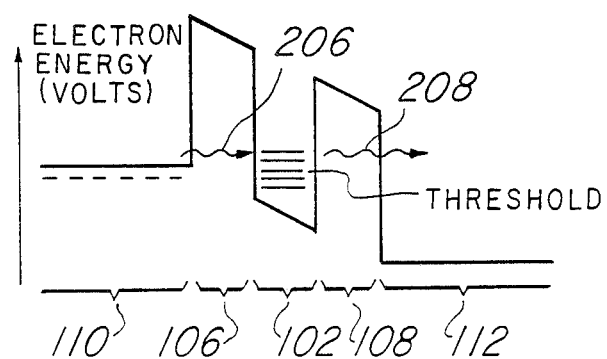
FIG. 20 is a band diagram for the fourth preferred embodiment.

Device 100 is illustrated in cutaway plan and cross sectional elevation views in FIGS. 19A and B, respectively. Device 100 includes a lattice of GaAs quantum wells 102 imbedded in a layer 104 of AlAs with $Al_xGa_{1-x}As$ tunneling barriers 106 and 108 also imbedded in AlAs 104 and in the form of lattices abutting the well lattice on both sides, and electrodes 110 and 112 of n-GaAs. Electrode 110 is biased negatively with respect to electrode 112 so that the conduction band edge aligns with the threshold shifted lowest energy level of wells 102; see FIG. 20. Thus the lowest level in a well 102 with neighboring wells conducting resonantly tunneling currents will be shifted up by the potential generated by the charge of these currents, and the shifting up of the lowest level to above threshold initiates resonant tunneling current through well 102, as suggested by the wavy arrows 200, 206 and 208 in FIGS. 19B and 20. Similarly, if the lowest level is below threshold (too few of the neighboring wells are conducting), then resonance is disrupted. As with device 80, the threshold can be adjusted by adjusting the bias, and the peripheral wells can be separately controlled by a separate electrode. Detection of the average state of wells 102 can be simply a measurement of the total tunneling current (essentially on or off) or by detection of the average state of a group of the peripheral wells.

Devices 80 and 100 can be fabricated by molecular beam epitaxy for growth of the $Al_xGa_{1-x}As$ layers with various x values and electron beam patterning and etching can be used to define the quantum wells.

MODIFICATIONS AND ADVANTAGES

Various modifications of the preferred embodiment devices while retaining the feature of using a cell-average output plus updating in a cellular automaton for overcoming noise and fault state induced changes. For example, the dimensions and shapes of the lattices can be varied: large (16 by 16) lattices of devices were used in the embodiments. The size and aspect ratio of the lattice can be varied to trade-off the switch and memory action of the devices. Smaller lattices permit more direct control of the total device lattice through the adjustment of the peripheral cells. Larger lattices permit an increased tolerance to thermal or electrically induced noise in the cell states. By changing the type of totalistic rule used, either memory or reversible switch action can be provided. Variation of the rule threshold within a given lattice can also be used to adjust the sensitivity of the system to noise, and to the external control signals.

The strength and range of direct intercell connection may be varied to trade-off performance with manufacturability. Allowing direct connection to larger numbers of cells increases the resistence of the device when operated as a two-state switch or memory. For stable operation the transition of a cell be a monotonic function of the total interaction between a cell and its connected neighbors.

Since the input control signals in either the peripheral or lattice mode of control can come from one or more sources by forming subgroups of the control lines, the device may also be used to provide a thresholding logic gate which resistant to errors caused by transient or permanent faults in a fraction of the device elements.

Finally, the device can be made unstable by using totalistic, but non-monotone rules. That is, if the cell interaction function F (lookup table) has a negative second defference (maximum) for a neighborhood state that is intermediate between all cells in state "1" and all cells in state "0", then oscillation in average state density can result. Moreover, since external control signals affect the average density of state "1" cells, this oscillatory action is programable. Thus, a variable frequency oscillator can be provided by such a device.

Furthermore, by mixing cells with different totalistic rules into this array, it should be possible to tailor the effective threshold value and construct rule combinations that evoke a dynamics that has a complex functional relationship with some external cell pattern.

Lastly, variations such as fabricating the lattice of cells monolithically in silicon, using three-state or more cells, interconnecting many devices into systems, and operation in extremely hostile environments are all within the scope of the invention.

What is claimed is:
1. An electronic device, comprising:
   (a) an aggregation of active cells, each of said cells having a finite number of states;
   (b) said cells locally interconnected and with the state of each cell at a time determined by the states at a previous time of the cells connected to said each cell, said determination characterized by said each cell is put into a first state if a weighted number of said connected cells at said previous time in said first state exceeds a threshold number;
   (c) an input for setting the state of at least one of said cells; and
   (d) an output for determining the state average over said aggregation;
   (e) whereby fault or noise induced changes of state in said cells are overcome by the influence of connected cells.
2. The device of claim 1, wherein:
   (a) said aggregation of cells is a planar lattice of cells; and
   (b) said input sets a plurality of cells in the periphery of said lattice.
3. The device of claim 1, wherein:
   (a) said cells have only two states.
4. The device of claim 3, wherein:
   (a) said cells are comparators; and
   (b) said interconnections are resistors.
5. The device of claim 3, wherein:
   (a) said cells are quantum wells in a semiconductor body;
   (b) said two states correspond to carriers occupying and not occupying said wells, respectively; and
   (c) said determination is by electric potential.
6. The device of claim 3, wherein:
   (a) said cells are quantum wells in a semiconductor body;
   (b) said two states correspond to carriers resonantly tunneling through and not resonantly tunneling through said wells, respectively; and
   (c) said determination is by electric potential.
7. The device of claim 3, wherein:
   (a) said aggregation of cells is a planar lattice of cells arranged into rows and columns;
   (b) said interconnections are between adjacent cells in rows, between adjacent cells in columns and between adjacent cells on the diagonals; and
   (c) said threshold number is between two and three of said adjacent row and column cells and between two and three of said adjacent diagonal cells with two of said adjacent row and column cells.
8. A noise and fault tolerant two-state device, comprising:
   (a) a cellular automaton with two-state cells and with an updating rule that updates a cell into a first state if a weighted number of the cells connected to said cell and in said first state exceeds a threshold number, with said weighting decreasing monotonically with increasing distance between cells;
   (b) a input for setting at least one of said cells; and
   (c) an output for determining the state average over said cells;
   (d) whereby noise and fault induced changes of state in said cells are overcome by updatings and averaging for output.
9. The device of claim 8, wherein:
   (a) said cellular automaton is a planar lattice of cells arranged into rows and columns; and
   (b) said weighting is zero except for nearest-neighbor and next-nearest-neighbor cells.
10. The device of claim 9, wherein:
    (a) said output averages the states of a group of cells on the periphery of said lattice.
11. The device of claim 9, wherein:
    (a) said input sets the states of a group of cells on the periphery of said lattice.

* * * * *